United States Patent
Templier et al.

(10) Patent No.: US 8,890,111 B2
(45) Date of Patent: Nov. 18, 2014

(54) METHOD FOR MANUFACTURING A VERY-HIGH-RESOLUTION SCREEN USING A NANOWIRE-BASED EMITTING ANISOTROPIC CONDUCTIVE FILM

(75) Inventors: Francois Templier, Voiron (FR); Laurent Clavelier, Grenoble (FR); Marc Rabarot, Saint-Egreve (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 94 days.

(21) Appl. No.: 13/503,480

(22) PCT Filed: Oct. 19, 2010

(86) PCT No.: PCT/FR2010/052218
§ 371 (c)(1),
(2), (4) Date: Apr. 23, 2012

(87) PCT Pub. No.: WO2011/048318
PCT Pub. Date: Apr. 28, 2011

(65) Prior Publication Data
US 2012/0205614 A1    Aug. 16, 2012

(30) Foreign Application Priority Data
Oct. 23, 2009 (FR) ..................................... 09 57467

(51) Int. Cl.
*H01L 33/04* (2010.01)
*H01L 27/15* (2006.01)
(Continued)

(52) U.S. Cl.
CPC ............. *H01L 27/156* (2013.01); *H01L 33/08* (2013.01); *H01L 33/18* (2013.01);
(Continued)

(58) Field of Classification Search
CPC ......... H01L 33/00; H01L 33/08; H01L 33/18; H01L 33/32; H01L 33/20; H01L 21/02603; H01L 29/0665; H01L 29/0676; H01L 29/06

USPC .................. 257/9, E33.005; 438/34; 977/762
See application file for complete search history.

(56) References Cited

U.S. PATENT DOCUMENTS

| | | | |
|---|---|---|---|
| 6,052,162 A | 4/2000 | Shimada et al. | |
| 6,340,822 B1 | 1/2002 | Brown et al. | |

(Continued)

FOREIGN PATENT DOCUMENTS

| | | |
|---|---|---|
| EP | 0 011 418 | 5/1980 |
| EP | 1 796 180 | 6/2007 |

(Continued)

OTHER PUBLICATIONS

Hsieh, Min-Yann et al., "InGaN—GaN Nanorod Light Emitting Arrays Fabricated by Silica Nanomasks." *IEEE Journal of Quantum Electronics*, vol. 44, No. 5, May 2008, pp. 468-472.

(Continued)

*Primary Examiner* — Asok K Sarkar
*Assistant Examiner* — Dmitriy Yemelyanov
(74) *Attorney, Agent, or Firm* — Occhiuti & Rohlicek LLP

(57) ABSTRACT

A method for producing an emissive pixel screen includes forming an active pixel matrix along which an electrode forming layer runs and having pixels arranged according to a distribution, forming an anisotropic substrate that includes a set of light emitting diodes constituted by parallel nanowires and arranged in an insulating matrix transversely with respect to a substrate thickness and having a density higher than a density of the pixels irrespective of the pixel distribution, connecting the substrate to the active pixel matrix by connecting only sub-groups of the parallel nanowires by a first end to separate pixel electrodes defined in the electrode forming layer according to the distribution of the pixels in the matrix, and connecting the sub-groups, by another end, to a common electrode, and delimiting the sub-groups by rendering the nanowires of the substrate that are arranged between the sub-groups emissively inactive.

12 Claims, 3 Drawing Sheets

(51) Int. Cl.
  *H01L 33/08* (2010.01)
  *H01L 33/18* (2010.01)
  *H01L 33/00* (2010.01)
  *B82Y 20/00* (2011.01)

(52) U.S. Cl.
  CPC ............ *H01L 33/0079* (2013.01); *B82Y 20/00* (2013.01)
  USPC .................. 257/9; 257/25; 257/183; 257/79; 438/34

(56) References Cited

U.S. PATENT DOCUMENTS

| | | | |
|---|---|---|---|
| 2003/0168964 A1 | 9/2003 | Chen | |
| 2004/0157354 A1* | 8/2004 | Kuriyama et al. | 438/45 |
| 2005/0179052 A1 | 8/2005 | Yi et al. | |

FOREIGN PATENT DOCUMENTS

| | | | |
|---|---|---|---|
| WO | WO 2004/042830 | 5/2004 | |
| WO | WO 2007/001099 | 1/2007 | |
| WO | WO 2007/085554 | 8/2007 | |
| WO | WO 2008/129859 | 10/2008 | |
| WO | WO 2010014032 A1 * | 2/2010 | H01L 33/08 |

OTHER PUBLICATIONS

Kim, Hwa-Mok et al., "High-Brightness Light Emitting Diodes Using Disloca ion-Free Indium Gallium Nitride/Gallium Nitride Multiquantum-Well Nanorod Arrays." *Nano Letters*, (2004) vol. 4, No. 6, pp. 1059-1062.

Zhao et al., "GaN based active matrix light emitting diode array by flip-chip technology," 2008 Asia Optical Fiber Communication & Optoelectric Exposition & Conference (AOE) IEEE Piscataway, NJ, 2008, p. 3, XP002585285.

Kim et al., "High-Brightness Light Emitting Diodes Using Dislocaion-Free Indium Gallium Nitride.Gallium Nitride Multiquantum-Well Nanorod Arrays," Nano Letters, vol. 4, No. 6, pp. 1059-1062 (2004) XP002368212.

International Search Report, PCT Application No. PCT/FR2010/052218, mailed Jan. 1, 2011 (3 pages).

* cited by examiner

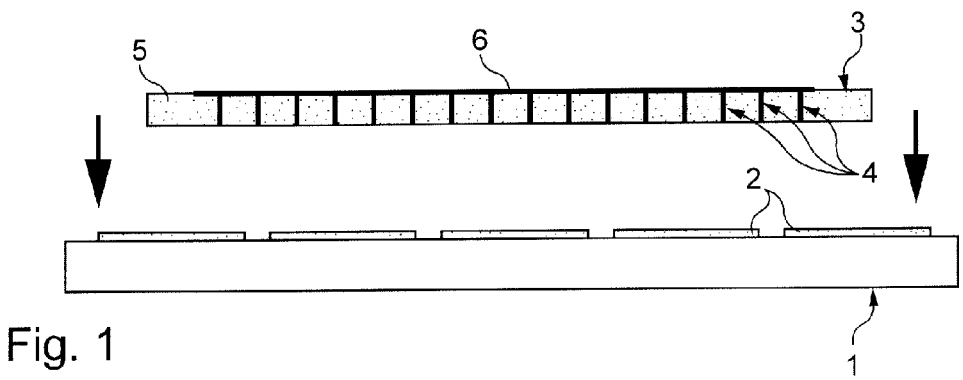
Fig. 1
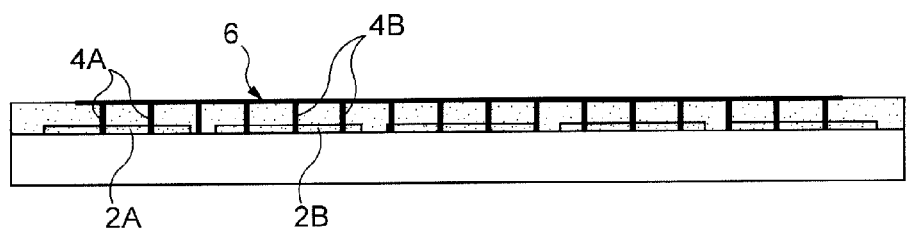
Fig. 2
Fig. 3
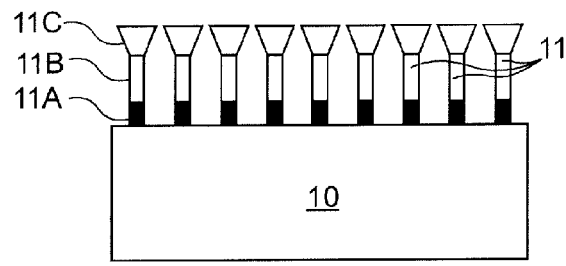
Fig. 4
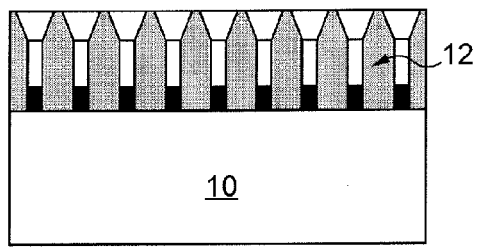
Fig. 5
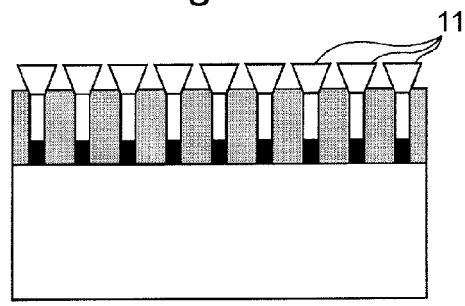
Fig. 6
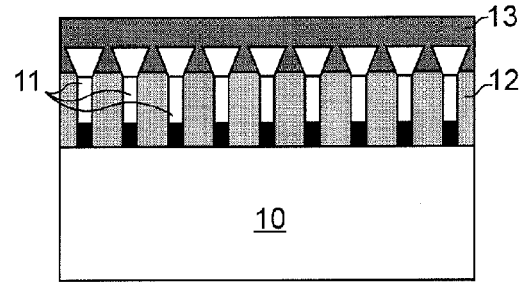

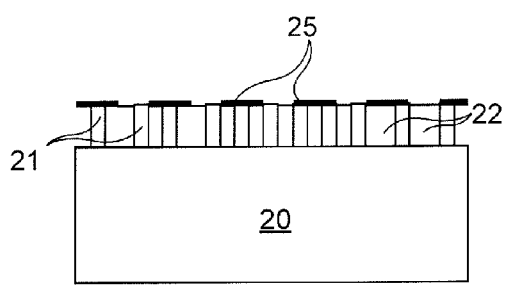
Fig. 7
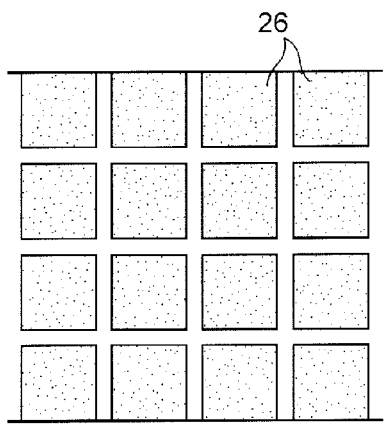
Fig. 8
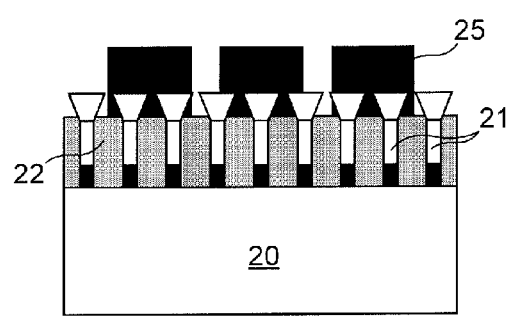
Fig. 9
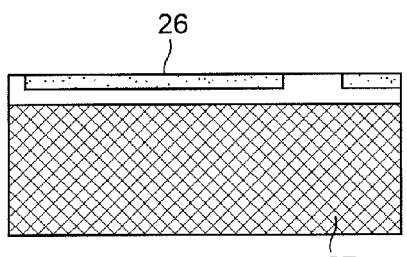
Fig. 10
Fig. 11
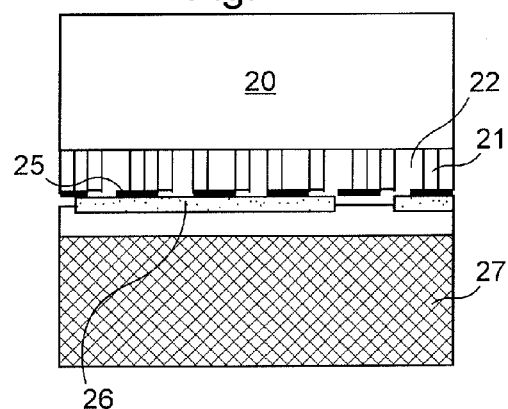
Fig. 13
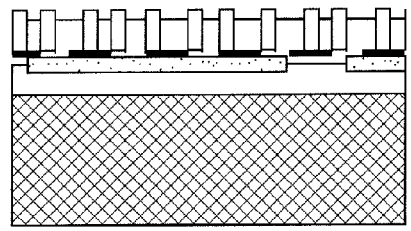
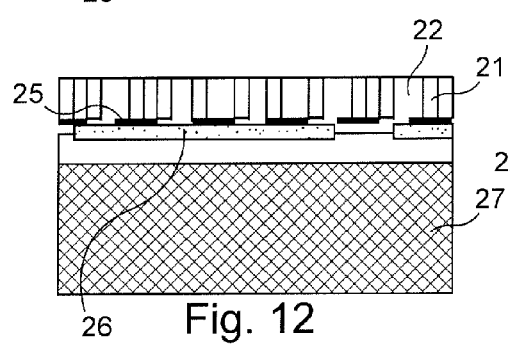
Fig. 12
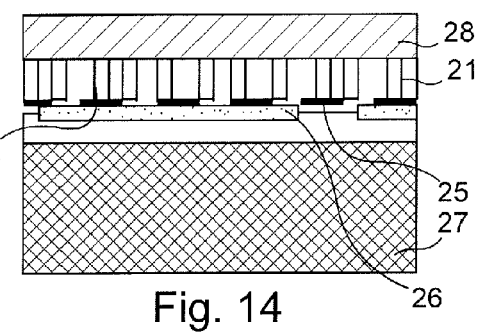
Fig. 14

METHOD FOR MANUFACTURING A VERY-HIGH-RESOLUTION SCREEN USING A NANOWIRE-BASED EMITTING ANISOTROPIC CONDUCTIVE FILM

CROSS-REFERENCE TO RELATED APPLICATIONS

This application is the National Stage of International Application No. PCT/FR2010/052218, filed on Oct. 19, 2010, which claims the benefit of the priority date of French Application No. 0957467, filed on Oct. 23, 2009. The content of these applications is hereby incorporated by reference in its entirety.

FIELD OF DISCLOSURE

The invention relates to the production of very-high-resolution emissive screens (with fixed pixels), whose pixel size is preferably at most equal to one micron; it can be a matter of small-sized screens (the term "micro-screens" is sometimes used) and/or of flexible screens. These screens, which can be flat (even if they have a certain curvature), are produced on integrated circuit active matrices, in practice made of silicon.

BACKGROUND

At present there are two types of high-resolution electro-optical screens: LCD (Liquid Crystal Display) screens—see in particular the document U.S. Pat. No. 6,052,162—and OLED (Organic Light Emissive Diodes) screens—see in particular the document WO-2007/085554. It can be noted that, unlike OLED screens, LCD screens are not emissive screens.

A problem common to these two types of screen is the difficulty in combining high resolutions (many image points or pixels) with a small screen size (in order to reduce the cost). It is therefore sought to produce increasingly smaller pixels, present-day pixels having a size of about 5 µm, and the ability to produce pixels whose size is 1 µm, or even 500 nm, is sought.

LCD or OLED screens are generally produced on an active matrix, which is in practice made of monocrystalline silicon, in which an integrated addressing circuit, based on transistors, is formed. It is also possible to produce this addressing circuit based on TFT (Thin Film Transistor) transistors. In this case, these transistors are produced in films of amorphous or polycrystalline silicon deposited on a glass substrate. Whatever the technology may be (LCD or OLED), the active matrix used comprises, along its surface in contact with electro-optical parts of the screen, electrodes defining the pixels of the screen: in order to take maximum advantage of the area of the active matrix, these pixel electrodes occupy the major part of this area.

Upon this active matrix are added electro-optical zones respectively situated opposite each pixel electrode (and under a counter-electrode). In the case of an LCD screen, the electro-optical zones are constituted by a liquid crystal whose transparency varies according to the polarization applied between the two electrodes. In the case of an OLED screen, the electro-optical zones, which are emissive, are constituted by a central portion of a light emitting diode which emits, or does not emit, radiation according to the state of excitation imposed by the transistors of the subjacent active matrix.

Respective types of constraints correspond to each type of screen.

In the case of LCD screens (in practice it is more precisely a matter of screens of the reflective LCOS (reflective "Liquid Crystal On Silicon" on integrated circuit) type or of the transmissive LCD on glass type (notably marketed by the Kopin company), one of the main problems for the small pixels is controlling the state of the liquid crystal between adjacent pixels. In fact, the field lines created at the level of a pixel can affect the field lines of the adjacent pixels, generating interference at the level of these pixels. This prevents the production of screens having pixels with a pitch of less than ~5 µm.

In the case of OLED screens (such as those of the companies Emagin, MED, or MicroOLED, in particular), the OLED diodes generate white light which is then colored, if necessary, by colored (typically red, green and blue) filters. In this case there is a matrix of pixel electrodes surmounted by a white OLED deposit and cooperating with a system of colored filters which is either deposited on the matrix (the case of the "Emagin" products) or produced on a glass plate and assembled with the active matrix (the case of the "MED" or "MicroOled" companies).

A first problem arises regarding the deposit of the layers constituting the OLED diodes on the active matrix. In fact, the pixel electrodes in practice constitute steps with respect to the surface of the active matrix; the fact that the emissive part is formed of layers causes these steps to remain in this emissive part; in particular the conductive layer forming the counter-electrode opposite the pixel electrodes (in practice it is a matter of the layer by which the emissive part terminates) thus comprises steps, which constitute risks of short-circuit (at the location of the level changes, the layers risk being interrupted and causing inadvertent contacts). In order to reduce this risk, it is necessary to apply, locally between the pixels, an insulating resin and thus to provide transition zones, the consequence of which is a loss of aperture of the active surface because of the design rules (this resin neutralizes the periphery of the pixel electrodes). The percentage of active surface (sometimes denoted by OAR) can drop to 25% for the case of 5 µm pixel pitches. It is understood that this problem hampers the production of high-resolution (small pixel) OLED screens by causing the percentage of emissive surface to drop.

A second problem concerns with the use of colored filters. In fact, whether these are deposited directly on the active matrix, or assembled with the active matrix, there is a loss of aperture related to the design rules in the first case, or related to the alignment precision in the second case. This results in an additional limitation of the active surface aperture.

A third problem concerns the extreme fragility of the OLED layers, in particular with regard to impurities such as water for example. Specific encapsulations are used but aging problems nevertheless persist with this type of screen. In addition to the above mentioned difficulties is the problem that, whatever technique is used (LCD or OLED), the possible presence of particles at the interface between the active matrix and the emissive layers generates risks of horizontal short-circuit between adjacent pixels (which is a crippling risk which considerably hampers the reduction of inter-pixel pitches and therefore the resolution).

SUMMARY

The purpose of the invention is to overcome the aforesaid disadvantages.

Thus one subject of the invention is a method for producing an emissive screen having a resolution of the order of one micron, or even less, in order to allow in particular the production of a screen of very small size, which is both simple (and of acceptable cost in industrial terms) and reliable, without necessitating complex positioning procedures between the components to be assembled.

Another subject of the invention is an emissive screen whose resolution is of the order of one micron, or even less, for example of the order of 500 nm.

The invention thus proposes a method for producing an emissive pixel screen, according to which an active pixel matrix is formed, along which a first electrode-forming layer runs, these pixels being arranged according to a predetermined distribution, there is formed a substrate formed of a set of light emitting diodes respectively constituted by parallel nanowires, arranged in an insulating matrix transversely with respect to its thickness with a density (strictly) higher than the density of pixels, irrespective of the predetermined distribution of these pixels, the substrate is connected to the active pixel matrix in such a way that only sub-groups of these nanowires are connected, by a first end, to separate pixel electrodes defined in the electrode-forming layer according to the distribution of the pixels in the active pixel matrix, whilst at least these sub-groups of nanowires are electrically connected, by another end, to a common electrode, these sub-groups being delimited during this connection step by rendering the nanowires of the substrate which are arranged between these sub-groups emissively inactive.

Thus, unlike the known methods, the invention proposes forming a set of light emitting diodes constituted of nanowires, irrespective of the dimensions and distribution of the pixel electrodes for which it is sought to form light emitting diodes, at least some of the nanowires thus formed then being emissively inactive, that is to say useless, or neutralized (that is to say that they are not connected to electrodes by their two ends), or quite simply eliminated. It is understood however that the fact of accepting the formation of useless nanowires makes it possible to allow an efficient connection between a large proportion of these nanowires and the pixel electrodes without having to provide precise positioning between the substrate and the pixel matrix; this results in a great simplification of the operations of positioning and connection between the active pixel matrix and the substrate comprising the nanowires.

This also results in a simplification of the operations of forming nanowires since, taking account of the current techniques for forming nanowires, the latter can easily, at the time of their formation, be distributed in a homogeneous manner, that is to say randomly over the whole of the substrate without particular precautions being taken with regard to their distribution if it is only their density which must be substantially constant all along the substrate which serves as their support and higher than the density of the pixels. Another advantage is that the formation of the anisotropic emissive substrates can be standardized, since there is no need to know the details of the final application of the latter, in particular with regard to the future distribution of the pixels.

In fact, the nanowires are advantageously distributed randomly in the insulating matrix with a substantially constant density.

At present there are two techniques for forming nanowires:

1. The first approach consists, starting from a solid substrate or from an epitaxial layer, in etching structures of nanowires, conventionally by means of a nano-lithographic and reactive plasma etching (ICP (Inductively Coupled Plasma), RIE (Reactive Ionic Etching), etc.) technique. This approach is notably described in the reference "InGaN—GaN Nanorod light Emitting Arrays Fabricated by Silica Nanomasks"; Min-Tann Hsieh and Al, IEEE journal of quantum electronics, Vol 44, pp 468-472, no. 5 May 2008. The etching approach therefore makes it possible to obtain wires of nanometric size with, however, certain limitations which depend on the nature of the material, the lithographic and etching methods, . . . , the advantage being that the orientation of the wires does not depend a priori on the crystalline orientation of the substrate.

2. The second approach consists in growing nanowires by chemical vapor deposition using a method of the VLS (Vapor Liquid Solidification) type which uses a generally metallic catalyst (gold for example). The nanowires often grow in epitaxial relationship with the substrate. Because of this, the vertical nanowires are obtained for a particular orientation of the substrate. The position and the diameter of the catalyst determine the position and the diameter of the nanowires, which can be less than 10 nm. This technique has certain advantages: very large form factors, control of dimensions of the nanowires, of the chemical composition and of the doping along the wires. There are also growth solutions without catalysts used for the generation of nanowires of GaN and ZnO or of heterostructures based on these materials by MOCVD (Metal Organic Chemical Vapor Deposition) and MBE (Molecular Beam Epitaxy) (see, in particular "High-Brightness Light Emitting Diodes Using Dislocation-Free Indium Gallium Nitride/Gallium Nitride Multiquantum-Well Nanorod Arrays", Hwa-Mok et al, Nano Letters 2004, Vol 4, no. 6 1059-1062).

Most of the work relating to the performance of LED structures constituted by nanowires is in the context of nanowires obtained by epitaxial growth.

In its basic principle, an LED is constituted by a P-N junction obtained by doping during the growth of the N-zone at the base of the nanowires, or of the "2D" layer for "conventional" LEDs, and of the P-zone at the top of the nanowires or of the "2D" layer (cf. the above article by Min-Tann Hsieh et al.).

It is important to note that the current methods for producing LEDs using anisotropic films with nanowire networks typically use the following steps (see the abovementioned documents):

formation of a network of nanowires starting from a growth substrate, encapsulation of this network in a glass matrix (of the SOG (Spin On Glass) type for example) or one made of polymer (for example lithographic resin)

formation of an electrode on this matrix and formation of a complementary electrode on an area of said growth substrate which is situated laterally distanced from the network of nanowires and therefore at a different level from that of the first electrode.

It should be noted that the arrangement of the second electrode beside the nanowires results from the difficulty there is in integrating a conductive or metal layer directly in the growth substrate of the wires (in fact it is not generally possible to implement a doping sufficient to allow the formation of such an electrode) without harming the epitaxial growth performance of nanowires and/or the overall performance of the final device. It is clear that the presence of these lateral electrodes is an obstacle to the obtaining of high-resolution screens taking advantage of the virtual totality of their surface.

In fact, in order to overcome this difficulty, the invention proposes in particular proceeding with a transfer of the layer of nanowires embedded in the insulating matrix onto the active pixel matrix from the support having made it possible to manipulate it up to the moment of the assembly.

The use of nanowires has also been proposed for the connection of circuits; it is thus that the document U.S. Pat. No. 6,340,822 proposes forming a set of nanowires which are, in sub-groups, connected to first circuits, the unused nanowires being eliminated at the same time as the support upon which the nanowires were formed (in fact, the nanowires are connected with each other only by the intermediary of this support since, when these nanowires are embedded in a layer, this layer is a sacrificial layer (for example a metal layer) which serves only for the equalizing of the lengths of the various nanowires); as a variant, the nanowires are formed in groups according to the geometry of the circuits to which they are intended to be fixed. The free ends of the nanowires thus fixed to the first circuits can then be fixed to second circuits placed precisely facing the first circuits (cross-pieces can be provided to prevent the buckling of the nanowires and to maintain the spacing between the circuits). It is understood that the sets of nanowires are a source of fragility, both during their manufacture and within the assemblies in which they participate, since they are connected to each other only by the intermediary of the circuits to which they are fixed by their ends; moreover, their fixing to the second circuits requires accurate positioning of the latter with respect to the first circuits. The proposals of this document therefore involve complex and costly procedures. It should be noted that this document is not preoccupied with the formation of a network of pixels.

According to advantageous features, possibly combined:
- during the step of formation of the anisotropic substrate, there is deposited on the insulating matrix a layer of electrically conductive material which is in electrical contact with first ends of these nanowires which are opposite to second ends connected to a support of this matrix, the connection step comprising the putting of this layer of electrically conductive material into firm contact with the electrode-forming layer; the layer of electrically conductive material and the electrode-forming layer advantageously comprise the same material,
- during the step of formation of the active pixel matrix, the pixel electrodes are delimited whilst, during the step of formation of the substrate, there is delimited in the layer of electrically conductive material an array of separate electrically conductive contacts such that each one is connected to at least the first end of a nanowire, the spacing between adjacent contacts being greater than the width of these first ends and the spacing between the pixel electrodes being greater than the size of the contacts, the consequence of this being, during the connection step, that certain of the contacts are connected to one of the pixel electrodes whilst other contacts are at a distance from the closest pixel electrodes and electrically isolated from them, the nanowires connected to these isolated contacts being emmissively inactive; the contacts preferably have dimensions such that each contact is connected to at least ten nanowires whilst each pixel electrode is connected to at least ten contacts; also in a preferred way, the array of pixel electrodes and the array of metal contacts are 2D square mesh arrays; advantageously, the contacts have dimensions smaller than 200 nm whilst the pixels have dimensions smaller than 1 micron,
- during the step of formation of the active pixel matrix, the electrode-forming layer is formed in the form of a continuous electrically conductive layer and, during the step of formation of the anisotropic substrate, the layer of electrically conductive material is formed in the form of a continuous conductive layer and, during the connection step, there is delimited in the set of nanowires of the substrate an array of sub-groups of nanowires separated by partitions made of insulating material whilst delimiting in the continuous layer said pixel electrodes opposite these sub-groups, the nanowires situated between these sub-groups being eliminated; advantageously, the sub-groups of nanowires and the pixel electrodes are delimited by etching through the substrate, through the continuous conductive layer and as far as through the electrode-forming continuous layer and then filling the etched zones with insulating material; in a more particularly preferred way, the insulating filling material is the same as the material of the insulating matrix,
- during the step of formation of the anisotropic substrate, the formation of said set of nanowires starting from a growth substrate is caused and this set of nanowires is encapsulated in the insulating matrix over a constant thickness such as to leave first ends of the nanowires bare (by way of example, an oxide is deposited which englobes and covers the nanowires and then the surface is planarized, by CMP (Chemical Mechanical Polishing) for example, until the first ends of the nanowires are bared),
- the common electrode is formed after putting the active pixel matrix in contact with this anisotropic substrate, the pixel electrodes being delimited (either because this delimitation occurred when the active matrix was formed or because these electrodes were delimited after assembly).

According to other advantageous features:
- the encapsulation step comprises a sub-step of excavation, capable of freeing (baring) a portion of the lateral surface of the nanowires in addition to their first ends (of their edges), such that the electrically conductive material deposited on the electrically insulating material coats the nanowires over a portion of their length,
- the nanowires are formed such that they are doped with a first type, either n or p, over a given fraction of their length starting from said ends, and the excavation is carried out over a depth at most equal to the length of this doped zone of said nanowires,
- the nanowires form multi-quantum wells produced by epitaxy and doping adapted during the epitaxy in order to improve the emission of light,
- the support of the emissive anisotropic substrate is eliminated by grinding and abrasion until this growth substrate is consumed,
- after elimination of this support, the layer of electrically insulating material is excavated in order to free (bare) a portion of the lateral surface of the nanowires (in addition to their other ends) over a portion of their length; this makes it possible to dope them and/or to coat them with a conductive layer thus ensuring very good electrical conduction between these ends and the conductive layer to which these ends are connected,
- the nanowires are formed such that they are doped (with the type opposite to the first type, if the first ends are doped) over a given fraction of their length starting from said other ends, and the excavation is carried out over a depth at most equal to the length of this doped zone of said nanowires,
- the nanowires have a ratio of the order of 10 between their height and their diameter, or even greater than 10,
- the density of the nanowires is at least equal to $10^7/cm^2$, preferably at least equal to $10^9/cm^2$; this density is preferably at least five times (or even 10 times) greater than that of the pixels,
- the nanowires are made of GaN, ZnO, InGaN, . . . .

The invention also proposes a screen designed to be obtained by the abovementioned method.

The invention thus proposes an emissive pixel screen, comprising an active pixel matrix along which pixel electrodes run, these pixels being distributed according to a predetermined distribution, a plurality of conductive contacts in contact with these pixel electrodes being selectively connected to them, a plurality of light emitting diodes respectively constituted by parallel nanowires and distributed in an insulating matrix transversely with respect to its thickness so as to form an anisotropic emissive substrate and these nanowires being distributed in sub-groups respectively connected by a first end to these pixel electrodes through these contacts, no contact being connected to more than one pixel electrode, and a common electrode connected to at least these sub-groups of nanowires by another end of the latter.

According to an advantageous embodiment, several contacts are connected to each pixel electrode, the spacing between these contacts being greater than the width of the nanowires, and the dimensions of each contact being less than the spacing existing between adjacent pixel electrodes.

According to another advantageous embodiment, to each pixel electrode there corresponds a single contact having the same dimensions, all of the nanowires being distributed between said sub-groups.

The pixel electrodes advantageously have a dimension at most equal to about 1 micron, with spacings of at most 200 nm.

Preferably, the nanowires of the anisotropic emissive substrate are distributed in the insulating matrix irrespective of the distribution of the pixels, nanowires situated between the sub-groups connected to the pixel electrodes through said contacts being emissively inactive.

BRIEF DESCRIPTION OF THE DRAWINGS

Subjects, features and advantages of the invention will emerge from the following description, given as a non-limiting illustrative example with reference to the appended drawings in which:

FIG. 1 is a diagrammatic view of an emissive anisotropic substrate at the point of being assembled with an active pixel matrix, FIG. 2 is a diagrammatic view of the assembly thus obtained, FIG. 3 is a diagrammatic view of a first step of formation of the substrate shown in FIG. 1, implementing the formation of a homogeneous set of nanowires, FIG. 4 is another diagrammatic view of it after encapsulation of the nanowires and planarization, typically by CMP, in order to make flush the edges of the wires, FIG. 5 is another diagrammatic view of it after baring the ends of the nanowires, FIG. 6 is another diagrammatic view of it after deposition of a conductive layer connected to said ends, FIG. 7 is a diagram of an emissive anisotropic substrate based on nanowires, after formation of a set of contacts each grouping several nanowires, according to a variant embodiment, FIG. 8 is a diagrammatic plan view of the active pixel matrix, FIG. 9 is a diagrammatic view of the substrate shown in FIG. 6, after formation of a set of contacts, according to the diagram shown in FIG. 7, FIG. 10 is a diagrammatic view of the active pixel matrix with which the substrate shown in FIG. 9 is at the point of being assembled, FIG. 11 is a diagrammatic view of the assembly of the substrate shown in FIG. 7 with the active matrix shown in FIG. 10, FIG. 12 is a diagrammatic view of it after elimination of the support of the substrate shown in FIG. 7, FIG. 13 is a diagrammatic view of it after baring the ends of the nanowires, FIG. 14 is a diagrammatic view of it after deposition of a conductive layer connected to said bared ends.

DETAILED DESCRIPTION

Figure 15:
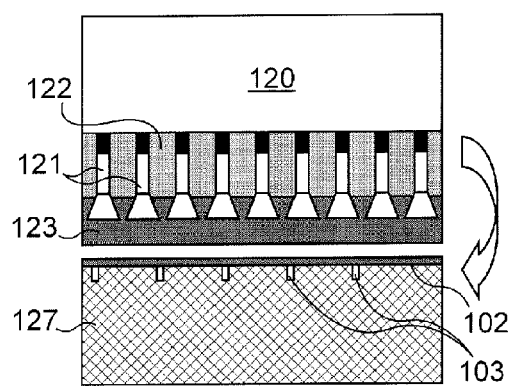
FIG. 15 is another diagrammatic view of a substrate such as the one shown in FIG. 6 at the point of being assembled, according to another embodiment, with an active pixel matrix covered by a continuous conductive layer, in which pixel electrodes have not yet been delimited.
Figure 16:
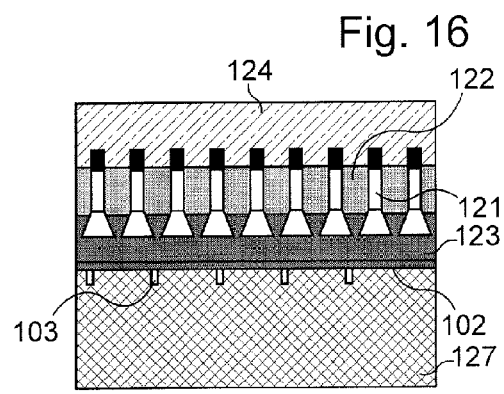
FIG. 16 is a diagrammatic view of it after elimination of the support of the nanowires and deposition of a continuous layer.

FIGS. 1 and 2 diagrammatically show the formation of an emissive pixel screen, able to be of very high resolution despite being of small size (and therefore having a very small pitch), according to an example embodiment of the invention.

On the one hand, there is formed an active pixel matrix 1, along which runs a first electrode-forming electrically conductive layer, these pixels being distributed according to a predetermined distribution (typically according to a 2D array having a rectangular or even square mesh). In the example shown, separate pixel electrodes 2 have already been formed in this electrode-forming layer.

Moreover, there is formed an emissive anisotropic substrate 3 formed from a set of light emitting diodes each constituted by parallel nanowires 4 distributed in an insulating matrix 5 transversely with respect to the thickness of this substrate. In the example shown, these nanowires 4 are already connected, by their ends situated opposite to the active pixel matrix, to a common electrode 6. The distribution of the nanowires in the substrate is homogeneous (although random) in the sense that their density is substantially constant, without it being possible to identify groups separated by isolating partitions. As will be explained below, the formation of these nanowires does not in fact need to take account of the geometry or of the distribution of the pixel electrodes of the active matrix 1.

The substrate is connected to the active pixel matrix such that (see FIG. 2) only sub-groups, not identified within the substrate before the connection operation, are connected, by a first end (bottom end) to the pixel electrodes 2; it is understood that the distribution of the sub-groups is determined by the distribution of the pixel electrodes.

On the other hand, nanowires not forming part of these sub-groups have their bottom ends which are at a distance from the pixel electrodes; they are therefore emissively inactive.

It is thus observed that the nanowires referenced 4A are connected to a first electrode 2A whilst the nanowires referenced 4B are connected to a second electrode 2B, whereas the nanowires 4' are neutralized, not being connected to any electrode. It is of little importance whether the number of nanowires within the sub-groups is or is not identical.

Because of their shape (they are separated by insulator), there is no horizontal conduction, from the electrical point of view, between the nanowires; it is a structure of the "anisotropic conductive film" type.

Thus, there is no possibility of short-circuit between two adjacent pixels by means of the emissive layer.

It is evident (see below) that FIGS. 1 and 2 are not true to scale, the dimensions of the nanowires in practice being very much less than those of the pixel electrodes.

It is understood that the simple fact that the substrate is placed facing the active pixel matrix suffices to determine, within the set of nanowires, those which contribute to the light emitting diode effect (that is to say that they are emissive), whilst the others, which are connected only to the common electrode 6, can remain in the substrate (without being emissive) without harming the performance of the screen thus formed.

The result of this is that the relative positioning between the active pixel matrix 1 and the emissive anisotropic substrate 3 is defined with a precision which does not need to be on the scale of the pixel electrodes.

By way of example, the emitters 4 are GaN light emitting diodes, made from nanowires, with dimensions which are typically as follows ("~" signifying that the following value is approximate): width: ~20 nm, height: ~400 nm, linear density: 10 to 50 $\mu m^{-1}$, which corresponds to spacings of the order of a few nanometers or a few tens of nanometers, which is very much smaller than the dimensions of the pixel electrodes which are a few microns or a few hundred nanometers). They emit a wavelength which can be fixed or distributed, according to the dimensions, notably lateral. The emitters 4 are separated by an insulator 5 which can be a polymer having properties of flexibility (high elongation yield point) or an inorganic layer of the SOG (Spin On Glass) type.

The conductive layer 6 forming a common electrode, connecting all of the upper parts of the diodes, can be a very thin metal layer such that it remains transparent (for example: Ag 20 nm), or a layer of a transparent conductive material of the ITO (Indium Tin Oxide) type (that is to say an indium oxide doped with tin).

The active pixel matrix is typically produced in a matrix of monocrystalline silicon but, as a variant, it can be a matter of TFT transistors made from amorphous or polycrystalline silicon deposited on a glass substrate. It is within the capability of those skilled in the art to produce such a pixel matrix having a pitch of the order of one micron or even of the order of a few hundred nanometers.

The emissive layer thus obtained is flexible and can be laminated onto a support which can be an active matrix (such lamination is in fact a possible way of producing the assembly of the emissive layer 3 with the active pixel matrix 1).

FIGS. 3 to 6 show steps in the formation of a substrate formed of nanowires adapted for forming light emitting diodes (heterojunction ones), of which two examples of use are then described (this substrate is not yet an emissive anisotropic substrate as represented in FIGS. 1 and 2).

FIG. 3 shows an initial configuration, with an initial substrate 10 (also called here a "growth substrate") upon which has been formed, in any appropriate known manner, an array of semiconductor nanowires 11 (by growth or by etching in particular), in a homogeneous manner, that is to say without seeking to produce any particular array having dense zones and zones substantially deprived of nanowires.

By way of example, the growth substrate is formed of silicon of <111> orientation and the nanowires are made of GaN, with a bottom part 11A which is "n" doped, in this case by silicon (coming from the substrate 10), a median part 11B which can comprise an intrinsic non-doped part possibly comprising an MQW (Multiple Quantum Wells) zone, and a top part 11C which is "p" doped, here by magnesium; the assembly forms a structure called a "P-I-N" structure.

FIG. 4 shows the configuration obtained after a step of encapsulation of the nanowires and of planarization carried out in such a way as to bare the ends of the nanowires to be electrically connected.

The encapsulation of the nanowires is advantageously carried out by deposition of an electrically insulating material 12, for example a layer of silica ($SiO_2$) or a layer of polymer (typically a conventional lithographic resin) or a layer of material of the sol-gel type. This deposit englobes and covers the nanowires. It is followed by a step of planarization of the surface. This planarization is for example carried out by means of a CMP (Chemical Mechanical Polishing) step, or by an RIE (Reactive Ion Etching) step.

The planarization of the encapsulation layer results in the fact that the first top ends of the nanowires (more particularly their edges) are free, at the same level as the free surface of the encapsulation material.

Advantageously, (see FIG. 5), the encapsulation layer is excavated in such a way as to free the peak of the nanostructures and thus to increase the surface available for an electrical contact (this includes in fact not only the first ends (the edges) of these nanostructures but also a part of their lateral surfaces). In the example shown, the height of the portion of the nanowires which is thus freed is that which corresponds to the "p" doping zone of the GaN nanowires; this height could, as a variant, be less than the height of the "p" doped zone.

The next step (see FIG. 6) is a step of deposition and planarization of a metal layer 13 (or of a set of layers) making it possible to ensure the electrical continuity (ohmic contact) with each of the nanowires emerging from the encapsulation layer 12.

Because of its very good flatness, the surface of the layer of nanowires thus produced (11+12+13) is adapted to be connected with high mechanical strength to the active pixel matrix (as mentioned above it can be a laminated assembly, which can result in molecular bonding, allowing good continuity of electrical conduction).

It is understood that the nanowires 11 correspond to the nanowires 4 shown in FIGS. 1 and 2, whilst the insulating material 12 corresponds to the matrix 5 shown in these figures.

It should be noted that the substrate shown in FIG. 6 constitutes an intermediate product which can be obtained in any way, able to be different from that described in FIGS. 3 to 6.

In the diagrammatic example of embodiment shown in FIGS. 1 and 2, the substrate formed of encapsulated nanowires is bonded onto the active pixel matrix without implementing the optional steps shown in FIGS. 5 and 6.

FIGS. 7 to 14 diagrammatically show a variant of this first example of production of a high-resolution screen according to the invention starting from the product shown in FIG. 6, which has the advantage in comparison with FIGS. 1 and 2 of ensuring good protection of the ends of the nanowires during their fixing to the active pixel matrix. The principle of this variant is shown diagrammatically in FIGS. 7 and 8, whilst its production is shown in greater detail in FIGS. 9 and 10, on the one hand, and in FIGS. 11 to 14 on the other hand.

The elements of these figures which are similar to those of FIGS. 3 to 6, are denoted by reference signs which are derived from those of these FIGS. 3 to 6 by the addition of the number 10.

As can be seen in FIG. 7, instead of having "free" ends (opposite to the support 20), all independent of each other, the nanowires 21 of FIG. 7 are connected by said free ends to conductive contacts (or islands) 25 distributed according to an advantageously regular distribution, according to a two-dimensional array, of constant pitch in this case.

The first advantage of these contacts is to group the nanowires (or nanotubes) in packets which are then electrically connected at the level of one of their ends and to facilitate the assembly with the active matrix between these contacts and the electrodes disposed on the active matrix.

Another advantage in providing such contacts is to make it possible to have, on the surface intended to be connected to the active pixel matrix, conductive zones 25 which are distributed more regularly than the nanowires themselves. In fact (see above), during the manufacture of the set of nanowires, the latter have in practice a distribution which exhibits geometric variations (there are not necessarily alignments parallel with the support, their cross-sections (approximately round such that they can be characterized by a diameter) can exhibit variations of several nanometers whilst their spacing can exhibit fluctuations able to be of the order of several tens of nanometers). The presence of the contacts makes it possible to form more regularly distributed sub-groups of nanowires, and the size of the contacts is advantageously sufficiently large in comparison with the cross-sections of the nanowires for there to be, statistically, despite the geometric fluctuations at the nanometric scale, a substantially constant number of nanowires connected to each of the contacts.

It is by the intermediary of these contacts 25 that the substrate is then linked and connected to the pixel matrix in which it can be seen in FIG. 8 that the pixel electrodes 26 are distributed according to the distribution desired for the screen to be produced, in practice a two-dimensional array, preferably according to two perpendicular directions; these electrodes are typically rectangular, for example square (as shown in this FIG. 8) in which case the pitch between contacts in both directions of the array can be identical.

These contacts have shapes and sizes such that, along each direction transverse to the nanowires, the spacing between adjacent contacts is substantially greater than the maximum cross-section of a nanowire (typically by at least 25%), and such that, also along each transverse direction parallel with the electrode-forming layer, the spacing between adjacent pixel electrodes is greater than the maximum dimension of the contacts (typically by at least 25%).

It is understood that, for reasons of legibility, the array of pixel electrodes shown in FIG. 8 is shown in too small a size to be able to comply with these rules.

In theory, the minimum distance between two pixels without there being a risk of short-circuit is the width of a diode, that is to say about 20 nm. In reality, the minimum distance between pixels is fixed by the microelectronic technology used for producing the pixel electrodes, which is currently of the order of 0.1 to 0.5 µm. The minimum pixel size is also fixed by the microelectronic technology for producing the active parts associated with each pixel, which makes it possible a priori to produce pixels as small as of dimension 1 µm (or even 500 nm), giving a density of the order of 1000 pixels per mm or 25400 pixels per inch, and therefore a very-high-resolution screen for a small dimension (for example: HDTV (High Definition TV) resolution obtained on a 2×3 mm chip).

By way of example, the nanowires have a diameter of about 20 nm with space able to vary between 5 and 80 nm (giving a pitch varying between 25 and 100 nm).

Also by way of example, the active pixel matrix is produced on silicon, using microelectronic technology. The pixel electrodes are conductive pads, typically made of copper, with a side dimension of 1 to 5 µm (or even less), spaced for example by 100 nm; they can be delimited by damasccene or dry etching.

The invention thus makes it possible to have 100% of the electrode surface emissive (to within the diode area filling rate), and a very high overall emissive percentage even for very small pixels because the space between pixels is very small (for example: pixels of side dimension 1 µm, spaced by 0.1 µm of separation, which gives an emissive aperture of about 80%).

As shown in FIG. 9, the contacts 25 are formed in the conductive metal layer 13, and the pixel electrodes of FIG. 10 are much bigger (in order to comply a little better with the proportion with the contacts than in FIG. 8, a single complete pixel 26 has been shown in it). The microelectronic part used for the control of the pixels within the active pixel matrix is denoted by the reference 27 (the parts associated with each pixel are not differentiated in it).

It is understood that the connection with the active pixel matrix is particularly efficient when the latter comprises on its surface a layer made from a material identical (or of very similar composition) to that of the layer 13; it is therefore advantageous to choose the same conductive material for the layer 13, and therefore for the contacts 25, as that of the electrode-forming layer.

One way of obtaining the contacts 25 is to proceed by lithography and etching of the metal. As indicated above:
the size of these contacts is related to the dimensions and spacings of the nanowires, to the performance of the lithographic techniques and to the spacing between pixels,
the principle is that these contacts are small compared with the size of the pixels and slightly smaller than the spaces between pixels.

It is important to note that in this way it is possible to assemble the anisotropic film and the active matrix without having to ensure accurate alignment (the directions of the array of contacts can thus be inclined with respect to those of the array of pixel electrodes).

The assembly of the substrate shown in FIG. 7 with the active matrix shown in FIG. 10 is shown in more detail in FIGS. 11 to 14.

In FIG. 11, the substrate is put into firm contact with the matrix, by the intermediary of contacts and pixel electrodes (molecular bonding occurs), without particular precaution with regard to the placing opposite of contacts and electrodes since the contacts are much smaller than the spaces between electrodes (there is therefore no risk of short-circuit between adjacent electrodes by a contact; it is furthermore recalled that, since the substrate is anisotropic, there is no risk of short-circuit between adjacent contacts). There are therefore no particular precautions to be taken in order to ensure any alignment between the nanowires and the pixel electrodes: the method is a self-aligned method.

It is therefore possible (see FIG. 12) to proceed, in any appropriate manner, with the removal of the substrate 20 from the layer constituted by the nanowires encapsulated in their insulating matrix. This removal can be obtained in particular by wet or dry chemical attack, or by erosion.

Preferably, an attack of the insulating material 22 is then carried out (see FIG. 13), over a small part of its thickness in order to bare the top ends of the nanowires (situated at the opposite end to those connected to the active pixel matrix). A possible planarization treatment can be applied (the top edges of the nanowires are thus bared).

Then (see FIG. 14), there is placed a conductive layer 28 connected to the top ends of all the nanowires (including those which are connected to contacts that are not connected to a pixel electrode). This layer, forming a common electrode for all of the nanowires, advantageously has a sufficiently small thickness to be transparent (taking account of the chosen material). It is understood that the connection between the nanowires and this electrode is improved when, as shown in FIG. 13, these ends have been bared over a fraction of their height. Because of this common electrode and of the pixel electrodes, the nanowires can then become emissive, according to what is determined by the portion of the active matrix which corresponds to each of the pixel electrodes.

The product thus obtained is an emissive pixel screen having very high resolution:
  the pixel pitch is very small, being of the order of 1 micron, or even only of the order of 0.5 µm (in the known solutions, the lower limit of pixel size for reliably producing, on an industrial scale, micro-screens having a high pixel density is in practice of the order of 5 µm),
  the gap between pixels can be only 0.1 82 m, or even less (whereas in the prior art this gap is at least 0.2 µm).

With regard to the percentage of emissive area of the screen obtained:
  it is of the order of 96% if the electrodes have a pitch of 5 µm and a gap of 0.1 µm (this rate is only of the order of 60% in the prior art),
  it is of the order of 81% if the electrodes have a pitch of 1 µm and a gap of 0.1 µm (whereas these dimensions do not exist in the prior art).

It should be noted that the delimitation of the sub-groups of nanowires respectively connected to the pixel electrodes, among the plurality of nanowires distributed in the matrix irrespective of the distribution of the pixel electrodes (preferably randomly with a substantially constant density), takes place at the time the substrate is put into contact with the matrix, through the contacts and pixel electrodes (see FIG. 11); similarly, the selection, within the nanowires of the substrate, of those which are finally emissively inactive results from this same putting into contact step, without having had to provide any particular alignment precaution.

A variant of the production method is shown diagrammatically in FIGS. 15 to 21. In these figures the elements similar to those of FIGS. 7 to 14 are denoted by reference numbers which are derived from those of these previous figures by addition of the number 100.

The principal differences between this variant and the method shown in FIGS. 7 to 14 relate to the fact that the useless nanowires are eliminated and by the fact that the delimitation of the pixel electrodes takes place after assembly of the encapsulated layer of nanowires with the active pixel matrix (simultaneously with the determination of contacts which are in exact correspondence with these pixel electrodes); it is no longer necessary to provide for the contacts to be smaller than the gap between electrodes.

In other words, according to this variant of the method according to the invention, it begins with assembling an anisotropic emissive film (still on its manufacturing support) and an active matrix and then the pixels are defined by etching this film.

As can be seen in FIG. 15, the method begins by assembling (as in FIG. 11) a substrate identical to the one shown in FIG. 6 on an active pixel matrix which is incomplete in comparison with the one shown in FIG. 10, in the sense that a continuous conductive layer 102 is formed in which pixel electrodes have not yet been delimited; however, as in the active pixel matrix shown in FIG. 1 or 10, there are connections between this electrode layer 102 and the individual control portions of pixels, in practice constituted by pixel control transistors (referenced in FIG. 15 with the reference 103 whereas they are not shown in FIG. 1 or in FIG. 10).

As before, this active pixel matrix is produced on silicon by microelectronic technology.

This assembly is of very good quality, notably from the electrical conductivity point of view, since it is produced along two electrically conductive layers (metal), namely the electrode layer 102 and the conductive layer connected to the ends of the nanowires situated at the opposite end to the support of these nanowires. As before, these conductive metal layers are advantageously made from identical materials or materials having similar compositions.

This assembly does not require particular precautions with regard to the relative positioning between the layer of encapsulated nanowires and the incomplete active pixel matrix.

After assembly, the support 120 is removed from the nanowires encapsulated in the insulating matrix 122 (as in FIG. 12). Advantageously, the insulating matrix is furthermore etched in such a way as to bare the top ends of the nanowires over a part of their height (as in FIG. 13) and then there is deposited a conductive layer 124 encapsulating these ends (as in FIG. 14—see FIG. 16). This conductive layer can be formed in the same way as the layer 28 shown in FIG. 14, for example by ITO deposition.

It is then that, simultaneously, batches of nanowires within the whole of the layer shown in FIG. 6 are delimited and the pixel electrodes are delimited, by etching patterns (patterning); these patterns are in practice rectangles, or squares, whose side dimension is advantageously chosen to be less than 5 microns, of the order of one micron or even less (for example of the order of 500 nm), with a spacing very much less than this side dimension, typically of a few hundred nanometers, for example 200 nm.

Figure 17:
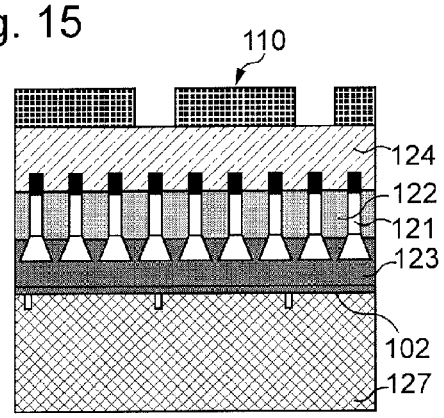
FIG. 17 is another diagrammatic view of it after formation of a mask on the continuous layer.
Figure 18:
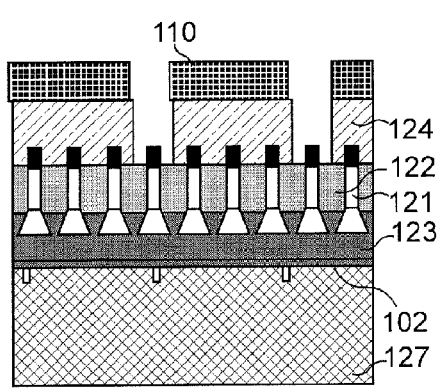
FIG. 18 is another diagrammatic view of it after etching the continuous layer through the mask.

In order to do this, the method begins by depositing a resin mask 110 corresponding to the patterns to be produced (see FIG. 17).

Then the etching of the conductive layer 124 (see FIG. 18) is carried out, for example by plasma.

Figure 19:
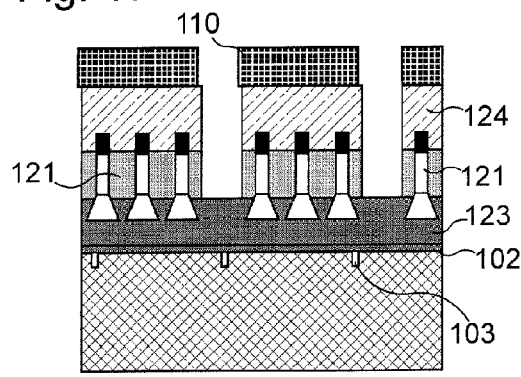
FIG. 19 is another diagrammatic view of it after etching the emissive anisotropic substrate through said mask.
Figure 20:
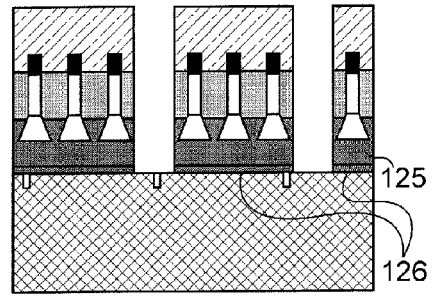
FIG. 20 is another diagrammatic view of it after etching the continuous layer of the active pixel matrix through said mask.
Figure 21:
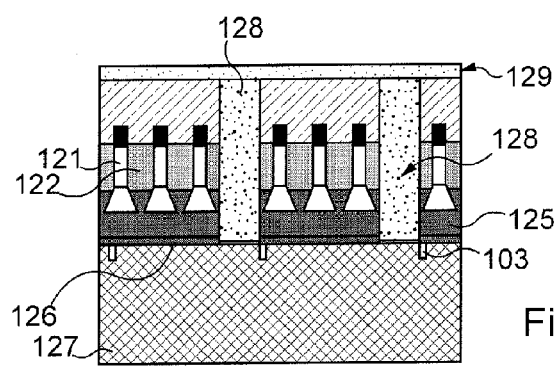
FIG. 21 is another diagrammatic view of it after filling the trenches resulting from the etching operations and formation of a continuous electrode over the portions of the substrate.

Then the etching is carried out, by any appropriate means, of the nanowires and of the insulating material situated under the etched zones of the layer 124 (the excavation is carried out through the mask 110—see FIG. 19).

Finally, the etching of the conductive layers 123 and 102 is carried out, by any appropriate means, and then the resin mask is eliminated (see FIG. 20); in this way there are formed contacts connected to groups of nanowires, as well as pixel electrodes which are very exactly opposite.

It is understood that the resin mask must be positioned opposite the active pixel matrix in such a way that each of the patterns is facing one of the connections 103. It should however be noted that the precision of such a positioning is simply of the order of one pixel.

It should in fact be noted that the delimiting of the sub-groups of nanowires connected respectively to the pixel electrodes, among the plurality of nanowires initially distributed in the matrix irrespective of the distribution of the pixel electrodes (preferably randomly with a substantially constant density), takes place, during the connection step, at the time of depositing the etching mask (see FIG. 11); similarly, the selection, among the nanowires of the substrate, of those which are finally emissively inactive (that is to say eliminated in this case) similarly results from this etching mask, without it being necessary to take any particular precaution of alignment between the sub-groups and the pixel electrodes (since the same mask is used for delimiting the sub-groups and the pixel electrodes).

The trenches formed by etching are then filled with an insulating material (for example a material identical or similar to that of the matrix 122 encapsulating the nanowires).

In order to provide a connection between the various portions of the layer 124, there is finally deposited a conductive layer 129, advantageously with the same material as that of this layer 124 and using the same method (ITO in the considered example).

In fact, this method allows poorer precision than that of FIGS. 7 to 14 because of the fact that it is necessary to align the etching mask at pixel level and then to etch several layers successively. That is why, according to this method, the minimum pixel size seems to have to be rather of the order of 1 to 2 µm (instead of 0.5 to 1 µm in the previously described method), with a minimum spacing of the order of ~200 nm (whilst the previous method makes it possible to drop to at least 100 nm).

However, as with the previous method, this method shown in FIGS. 15 to 21 contributes a significant improvement in comparison with the prior art, in particular because the nanowires are self-aligned with respect to the pixel electrodes and are anisotropic (there is therefore no risk of transverse short-circuits between pixels, without having to reduce the emissive aperture).

It should be noted that it is possible to produce flexible emissive screens with the two approaches described above, with some modifications:

With regard to the active matrix, it suffices to add a sacrificial layer (for example of the polyimide type) which makes it possible (as is known per se for certain present-day screens) to detach the assembled set from the original rigid substrate (in fact the control part 27 or 127 is thinner than shown and is carried by a rigid support; when this support is removed, the control layer exhibits an entirely significant flexibility).

With regard to the emissive part, there is in principle nothing to modify because the emissive layer, such as it is designed and taking account of its thinness, has the advantage of being "intrinsically flexible".

It should be noted that the invention makes it possible to take great advantage of nanowires for producing emissive screens with fixed pixels, by proposing the dissociation of a homogeneous set of nanowires encapsulated in an insulating matrix from a support (it can be a matter of a support having been used for the growth of the nanowires, or an intermediate support) after assembly with an active matrix (complete or incomplete, with regard to the delimitation of the pixel electrodes), which makes it possible to form a common electrode on the thus bared surface; in other words the insulating layer encapsulating the nanowires is the subject of at least one step of transfer from one support to another (the active pixel matrix).

The formation of the layer containing the nanowires can be carried out completely independently from the assembly with the active pixel matrix, without knowing its characteristics; it can thus be carried out by different participating individuals, at different places and/or at different times, which contributes to a reduction in costs, since this formation step can be standardized irrespective of future applications.

As described above, the step of encapsulation of the nanowires in a layer of electrical insulator is advantageously completed by a partial etching (excavation) of the encapsulation layer after planarization at the level of the first free ends of the nanowires, in order to increase substantially the electrical contact area on the periphery of the wires (these wires are bared over a small fraction of their length in addition to on their edges). Moreover, since there is a transfer of this encapsulation layer from one support to another, the formation of the nanowires can be carried out on a support chosen independently from the characteristics of the active matrix to which the latter will be fixed.

The invention claimed is:

1. An apparatus comprising an emissive pixel screen, said emissive pixel screen comprising:
    an active pixel matrix along which pixel electrodes run, said active pixel matrix having pixels distributed according to a predetermined distribution,
    a plurality of conductive contacts in contact with and selectively connected to said pixel electrodes,
    a plurality of light emitting diodes each including parallel nanowires and distributed in an insulating matrix transversely with respect to a thickness thereof to form an anisotropic emissive substrate, said nanowires being distributed in sub-groups respectively connected by a first end to one side of the conductive contact, the conductive contact being connected, by the opposite side, to a respective pixel electrodes, no contact being connected to more than one pixel electrode, and
    a common electrode connected to at least said sub groups of nanowires by another end of said nanowires,
    wherein each pixel electrode is in contact with and selectively connected to several contacts, the spacing between these contacts being greater than the width of the nanowires, and the dimensions of each contact being less than the spacing existing between adjacent pixel electrodes.

2. The apparatus of claim 1, wherein said nanowires of said anisotropic emissive substrate are distributed in said insulating matrix irrespective of said distribution of said pixels, nanowires situated between said sub-groups connected to said pixel electrodes through said contacts being emissively inactive.

3. The apparatus of claim 1, wherein the pixel electrodes and the conductive contacts are made from the same conductive material.

4. A method for producing an emissive pixel screen, said method comprising:
    forming an active pixel matrix along which an electrode forming layer runs and having pixels arranged according to a predetermined distribution;
    forming an anisotropic substrate that includes a set of light emitting diodes constituted by parallel nanowires and arranged in an insulating matrix transversely with respect to a thickness of said anisotropic substrate and having a density higher than a density of said pixels irrespective of said predetermined distribution of said pixels;
    connecting said anisotropic substrate to said active pixel matrix by connecting only sub-groups of said parallel nanowires by a first end to separate pixel electrodes defined in said electrode forming layer according to said distribution of said pixels in said active pixel matrix; and
    connecting said sub-groups, by another end, to a common electrode, delimiting said sub-groups by rendering said parallel nanowires of said anisotropic substrate that are arranged between said sub-groups emissively inactive;
    wherein forming said anisotropic substrate comprises depositing, on said insulating matrix, a layer of electrically conductive material that is in electrical contact with first ends of said nanowires that are opposite to second ends connected to a support of said insulating matrix;

wherein connecting said anisotropic substrate to said active pixel matrix comprises putting said layer of electrically conductive material into firm contact with said electrode forming layer; and wherein forming said active pixel matrix comprises delimiting said pixel electrodes, and forming said anisotropic substrate further comprises delimiting, in said layer of electrically conductive material, an array of separate electrically conductive contacts such that each contact is connected to at least said first end of a nanowire, a spacing between adjacent contacts which is greater than a width of said first ends, and a spacing between said pixel electrodes which is greater than a size of said contacts, whereby, during said connection step, certain of said contacts connect to one of said pixel electrodes while other contacts are at a distance from said closest pixel electrodes and electrically isolated from said closest pixel electrodes, said nanowires connected to said isolated contacts being emmissively inactive.

5. The method of claim 4, wherein said layer of electrically conductive material and said electrode forming layer are made of the same material.

6. The method of claim 4, wherein said contacts have dimensions smaller than 200 nanometers and said pixels have dimensions smaller than 1 micron.

7. The method of claim 4, wherein forming said anisotropic substrate comprises causing formation of a set of nanowires starting from a growth substrate, said set of nanowires being encapsulated in said insulating matrix such as to leave first ends of said nanowires bare.

8. The method of claim 4 wherein said common electrode is formed after putting said active pixel matrix in contact with said anisotropic substrate, said pixel electrodes being delimited.

9. The method of claim 4, wherein said nanowires are distributed in said insulating matrix randomly but with a substantially constant density.

10. A method for producing an emissive pixel screen, said method comprising:
  forming an active pixel matrix along which an electrode forming layer runs and having pixels arranged according to a predetermined distribution, forming an anisotropic substrate that includes a set of light emitting diodes constituted by parallel nanowires and arranged in an insulating matrix transversely with respect to a thickness of said anisotropic substrate and having a density higher than a density of said pixels irrespective of said predetermined distribution of said pixels;
  connecting said anisotropic substrate to said active pixel matrix by connecting only sub-groups of said parallel nanowires by a first end to separate pixel electrodes defined in said electrode forming layer according to said distribution of said pixels in said active pixel matrix; and
  connecting said sub-groups, by another end, to a common electrode, delimiting said sub-groups by rendering said parallel nanowires of said anisotropic substrate that are arranged between said sub-groups emissively inactive;
  wherein forming said anisotropic substrate comprises depositing, on said insulating matrix, a layer of electrically conductive material that is in electrical contact with first ends of said nanowires that are opposite to second ends connected to a support of said insulating matrix;
  wherein connecting said anisotropic substrate to said active pixel matrix comprises putting said layer of electrically conductive material into firm contact with said electrode forming layer; and
  wherein forming said active pixel matrix comprises forming said electrode forming layer as a continuous electrically conductive layer and, forming said anisotropic substrate comprises forming said layer of electrically conductive material formed as a continuous conductive layer and, connecting said anisotropic substrate to said active pixel matrix comprises delimiting, in said nanowires of said anisotropic substrate, an array of sub-groups of nanowires separated by partitions made of insulating material while delimiting in said continuous layer said pixel electrodes opposite said sub-groups, said nanowires of said anisotropic substrate situated between said sub-groups being eliminated.

11. The method of claim 10, wherein delimiting said sub-groups of nanowires and said pixel electrodes comprises etching through said anisotropic substrate, through said continuous conductive layer and through said electrode-forming continuous layer, and filling said etched zones with insulating material.

12. The method of claim 11, wherein said insulating filling material and said insulating matrix are made of the same material.

* * * * *